(12) United States Patent
Bradley

(10) Patent No.: US 7,521,939 B2
(45) Date of Patent: Apr. 21, 2009

(54) CIRCUITS TO INCREASE VNA MEASUREMENT BANDWIDTH

(75) Inventor: Donald A. Bradley, Morgan Hill, CA (US)

(73) Assignee: Anritsu Company, Morgan Hill, CA (US)

( * ) Notice: Subject to any disclaimer, the term of this patent is extended or adjusted under 35 U.S.C. 154(b) by 533 days.

(21) Appl. No.: 11/317,107

(22) Filed: Dec. 22, 2005

(65) Prior Publication Data
US 2007/0159182 A1    Jul. 12, 2007

(51) Int. Cl.
*G01R 27/04* (2006.01)
*G01R 27/32* (2006.01)

(52) U.S. Cl. .................... 324/638; 324/642
(58) Field of Classification Search ........... 324/638
See application file for complete search history.

(56) References Cited

U.S. PATENT DOCUMENTS

| | | | | |
|---|---|---|---|---|
| 4,780,661 A | * | 10/1988 | Bolomey et al. | ............ 324/638 |
| 5,072,189 A | * | 12/1991 | Openlander | ................. 324/638 |
| 5,773,985 A | * | 6/1998 | Bradley | ....................... 324/642 |
| 5,977,779 A | | 11/1999 | Bradley | |
| 6,020,733 A | * | 2/2000 | Bradley | .................... 324/76.23 |
| 6,421,624 B1 | * | 7/2002 | Nakayama et al. | .......... 702/117 |
| 6,735,424 B1 | * | 5/2004 | Larson et al. | ............ 455/250.1 |
| 6,888,342 B2 | * | 5/2005 | Bradley | .................... 324/76.19 |
| 7,019,510 B1 | * | 3/2006 | Bradley | .................... 324/76.23 |

OTHER PUBLICATIONS

"Agilent RF and Microwave Test Accessories," Agilent Technologies, www.agilent.com/find/assist, Dec. 2000.
"Mini-Circuits Directional Couplers," Sep. 1999.
Operation Guide for HP 86205A, pp. 2-2 to 2-10, at least as early as Dec. 20, 2005.

* cited by examiner

*Primary Examiner*—Vincent Q Nguyen
*Assistant Examiner*—Jeff Natalini
(74) *Attorney, Agent, or Firm*—Fliesler Meyer LLP

(57) ABSTRACT

Embodiments of the present invention relate to circuits to be inserted in a signal path between a signal generator and a test port of a vector network analyzer (VNA), where the circuits enable the VNA to make scattering parameter measurements for a load (RL) connected to the test port when the signal generator generates signals having frequencies that are below a low frequency limit (e.g., 2 MHz) of an actual dual directional coupler of the VNA. Embodiments of the present invention are also directed to a VNA that includes such circuits.

25 Claims, 7 Drawing Sheets

CIRCUITS TO INCREASE VNA MEASUREMENT BANDWIDTH

FIELD OF THE INVENTION

Embodiments of the present invention relate to vector network analyzers (VNAs). More particularly, embodiments of the present invention relate to circuits that enable a VNA to make measurements over a large frequency range (e.g., DC to 8 GHz).

BACKGROUND

FIG. 1 is a high level diagram of a conventional vector network analyzer (VNA) 100 which is shown as including a signal generator 102 (also known as a voltage source) having a source impedance RS, a forward coupler 104, a reverse coupler 106, one or more test port 108, a receive/detector 110 and a processor/display 120. The signal generator 102 produces signals that are transmitted to a test device, shown as a resistive load RL, which is connected to one or more test port 108 of the VNA. The resistive load RL, also known as a device under test (DUT), can be, e.g., an open, a short, or anything in-between.

The forward coupler, which includes a resistive bridge having an impedance $R_F$, provides a forward signal (also known as an incident signal) to a first input of the receiver/detector 110. The reverse coupler 108, which includes a resistive bridge having an impedance $R_R$, provides a reverse signal (also known as a reflected signal) to a second input of the receiver/detector 110. The forward signal is often referred to as signal VF hereafter. Similarly, the reverse signal is often referred to as signal VR hereafter. In the arrangement shown, the forward coupler 104 and the reverse coupler 106 together form what is known as a dual directional coupler. Preferably, the impedances of the source, the load and the couplers 104 and 106 all match (i.e., preferably $R_S=R_L=R_F=R_R$). A typical value for $R_S$, $R_L$, $R_F$ and $R_R$ is 50 ohms, or 75 ohms, but other values may be used.

The receiver/detector 110, which is tuned to the frequency of the signal generator 102, likely includes components such as a local oscillator (LO), band-pass filters (BPFs) and a synchronous detector or digital-signal processor (DSP). The LO is used to mix received RF signals down to lower intermediate frequency (IF) signals and baseband signals. The BPFs are used to filter out undesired harmonics and noise from the IF and baseband signals. The synchronous detector or DSP is used to extract magnitude and phase information from the baseband signals, which can be, e.g., about 200 KHz signals. More specifically, the synchronous detector or DSP can converts the VF and VR signals into digital signals indicative of real and imaginary components of the VF signal and real and imaginary components of the VR signal. The processor/display 120 formats the reflection and transmission data in ways that make it possible to interpret results of measurements.

Conventional forward and reverse couplers 104 and 106 typically have a low frequency limit of approximately 1 or 2 MHz. This is primarily due to the balun used to create the single ended to differential signal for the resistive bridge of the coupler. More specifically, a conventional coupler typically includes a coaxial transmission line surrounded by Ferrite beads of about a quarter inch in length. A coupler with one quarter inch Ferrite bead will enable use of the coupler down to about 2 MHz. To get down to about 1 MHz, two such quarter inch Ferrite beads are needed; to get down to about 0.5 MHz, four such quarter inch ferrite beads are required; and so on. Accordingly, it can be appreciated that it would be prohibitive to produce a coupler useful down to about DC, using the above described methodology. Nevertheless, there is a desire to measure S-parameters down to DC. Accordingly, there is a need for couplers that are useful down to DC.

SUMMARY

Embodiments of the present invention are directed to circuits to be inserted in a signal path between a signal generator and a test port of a vector network analyzer (VNA), where the circuits enable the VNA to make scattering parameter measurements for a load (RL) connected to the test port when the signal generator generates signals having frequencies that are below a low frequency limit (e.g., 2 MHz) of an actual dual directional coupler of the VNA. Embodiments of the present invention are also directed to a VNA that includes such circuits.

In accordance with an embodiment of the present invention, the circuit includes an attenuator (e.g., a pi-attenuator) that is inserted in the signal path between the signal generator and the test port. The circuit also includes a monitoring circuit connected to the attenuator to monitor voltages at two nodes along the signal path that are formed by the attenuator. Additionally, the circuit include a dual directional coupler emulation circuit, made up of op-amps and resistors, connected to the monitoring circuit to emulate a dual directional coupler at frequencies that are below the low frequency limit of an actual dual directional coupler. Outputs of the dual directional coupler emulation circuit are indicative of signals that are incident on and reflected from the load (RL), and thus can be used to measure scattering parameters of the load (RL).

In accordance with an embodiment of the present invention, the dual directional coupler emulation circuit includes a first circuit portion that emulates a forward coupler, as well as a second circuit portion that emulates a reverse coupler.

In accordance with an embodiment of the present invention, when the circuit is inserted in a VNA that includes an actual dual directional coupler, the circuit is preferably inserted in the signal path of the VNA such that it is between the signal generator and the actual dual direction coupler of the VNA.

Further and alternative embodiments, and the features, aspects, and advantages of the present invention will become more apparent from the detailed description set forth below, the drawings and the claims.

DETAILED DESCRIPTION

Figure 1:
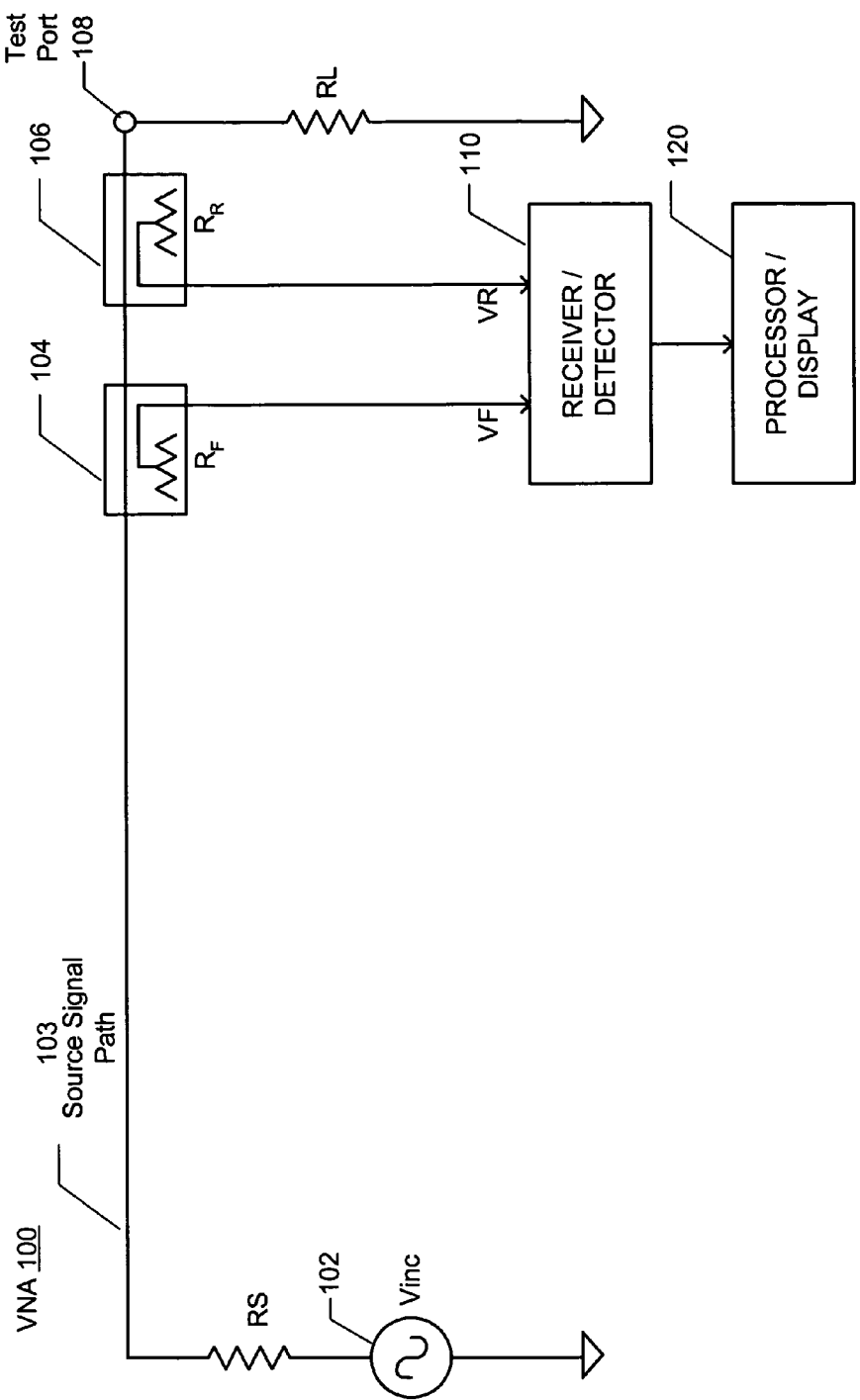
FIG. 1 is a high level block diagram of a conventional vector network analyzer (VNA) that can not make measurements below the low frequency limit of the dual directional coupler of the VNA.
Figure 2:
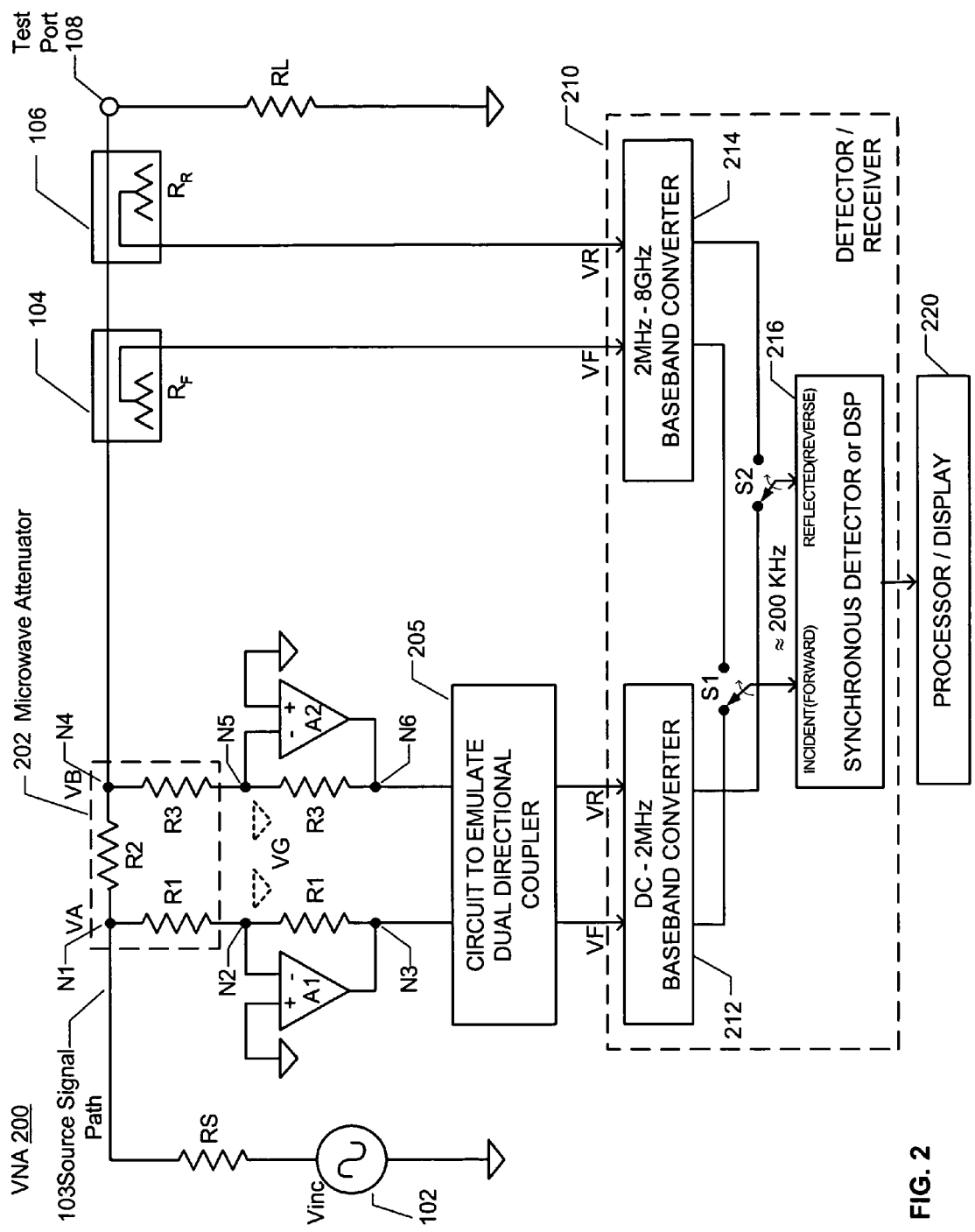
FIG. 2 is a high level diagram of a VNA that, in accordance with embodiments of the present invention, that can make measurements below the low frequency limit of the actual dual directional coupler of the VNA.

FIG. 2 is a high level diagram of a VNA 200 that, in accordance with embodiments of the present invention, can make measurement from DC to about 8 GHz. As shown in FIG. 2, embodiments of the present invention allow the use of conventional forward and reverse couplers 106 and 108 to be used for their intended frequency coverage from the low MHz (e.g., 2 MHz) to the mid GHz (e.g., 8 GHz) range. The addition of a low value (e.g., <1 dB) attenuator 202 placed in the source signal path 103 before the couplers 106 and 108 allows a convenient monitoring point to derive DC to 2 MHz forward and reverse voltage parameters. More specifically, embodiments of the present invention allow S-parameters to be measured down to DC, or at least close thereto. Preferably, embodiments of the present use no switches in the source signal path 103, which would cause additional losses as well as switching uncertainties.

In accordance with an embodiment of the present invention, the attenuator 202, which is shown as including three resistors (i.e., R1, R2 and R3), is a pi-attenuator, which is given that name because the configuration of resistors R1, R2 and R3 resemble the symbol pi (i.e., $\pi$). Characteristics of the attenuator 202 are described with reference to FIG. 3, and Equations 1-3. The insertion loss of the attenuator is preferably low, e.g., below 1 dB. However, embodiments of the present invention also encompass those situations where the attenuator has a greater insertion loss. Further, while the use of a pi-attenuator is preferred, use of other attenuators are within the scope of the present invention. For example, it is possible to string two T-attenuators together to form two shunt arms. Five resistors (instead of three) would be used to form the two T-attenuators, and the math would differ due to the five resistors. For the following discussion, it is assumed that a pi-attenuator is used.

Figure 3:
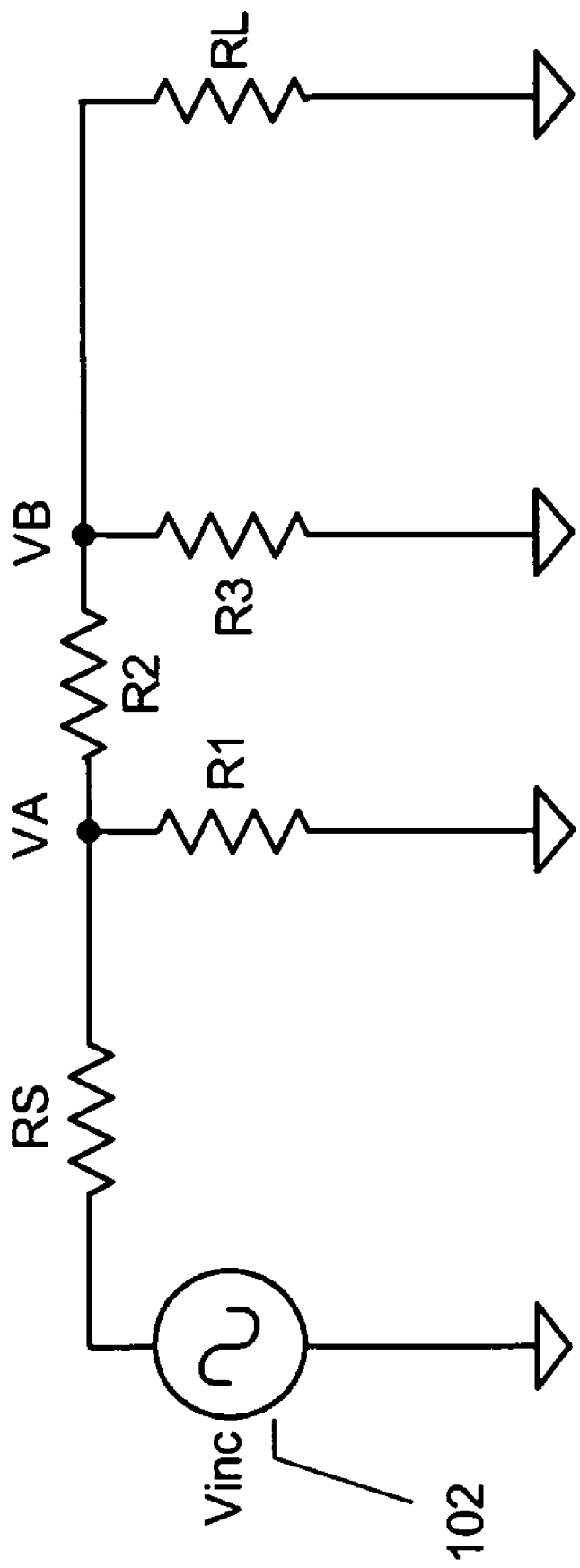
FIG. 3 is a circuit diagram that is useful for explaining the known characteristics of a pi-attenuator.

Equation 1 below is an equation for the voltage (VA) in FIG. 3, which is the voltage at node (N1) in FIG. 2. In this and further equations, Vinc is the "incident" voltage generated by the voltage source 102.

$$VA = Vinc \frac{R1 \cdot R2 \cdot R3 + RL(R1 \cdot R2 \cdot + R1 \cdot R3)}{R1(R3 \cdot RS + R2 \cdot R3) + R2 \cdot RS + RL(R1(R2 + R3 + RS) + RS(R2 + R3))} \quad (EQ. 1)$$

Equation 2 below is an equation for the voltage (VB) in FIG. 3, which is the voltage at node (N2) in FIG. 2.

$$VB = VA \frac{RL \cdot R3}{R2 \cdot R3 + RL(R2 + R3)} \quad (EQ. 2)$$

Combining Equations 1 and 2 results in Equation 3 shown below.

$$VB = Vinc \frac{R1 \cdot R2 \cdot R3}{R1(R3 \cdot RS + R2 \cdot R3) + R2 \cdot RS + RL(R1(R2 + R3 + RS) + RS(R2 + R3))} \quad (EQ. 3)$$

Figure 4:
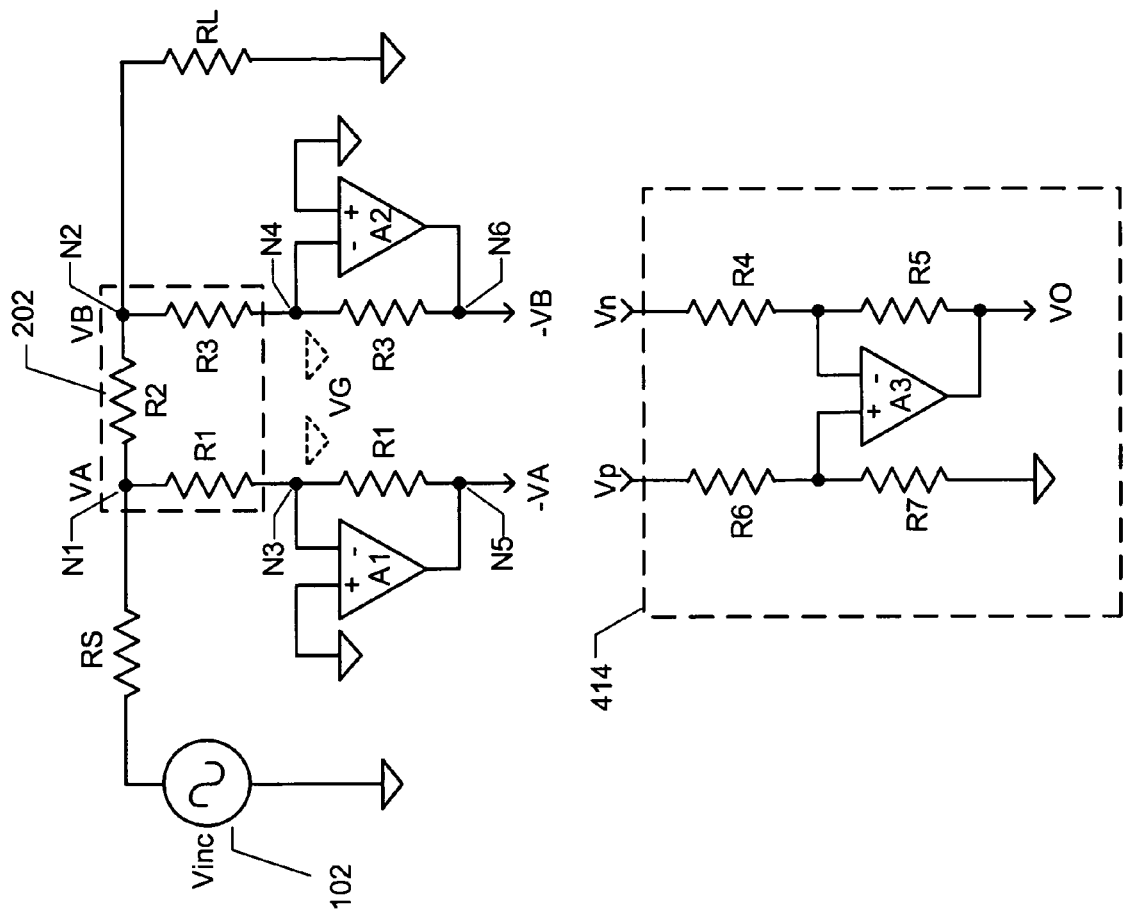
FIG. 4 is a circuit diagram that is useful for explaining how op-amps can be used to emulate characteristics of a reverse coupler and a forward coupler at relatively low frequencies (i.e., frequencies in the range of DC to a few MHz), in accordance with embodiments of the present invention.

FIG. 4 illustrates how a pair of op-amps A1 and A2 can be used to monitor the voltages VA and VB, which as mentioned above, are the voltages at nodes N1 and N2. As can be seen, the non-inverting (+) input of the op-amp A1 is connected to ground; the inverting (−) input of the op-amp A1, which is the summing input of the op-amp A1, is connected to one of the arms of the attenuator 202; and a feedback resistor equal to the resistor R1 is connected between the inverting (−) input and the output of the op-amp A1. Similarly, the non-inverting (+) input of the op-amp A2 is connected to ground; the inverting (−) input of the op-amp A2, which is the summing input of the op-amp A2, is connected to the other one of the arms of the attenuator 202; and a feedback resistor equal to the resistor R3 is connected between the inverting (−) input and the output of the op-amp A2. This arrangement will result in a voltage −VA at the output of the op-amp A1 (i.e., Node N5), and a voltage −VB at the output of op-amp A2 (i.e., Node N6). In other words, in the arrangement shown, the op-amps A1 and A2 are use used to monitor the voltages VA and VB at nodes N1 and N2 of the source signal path 103. This is only good within the bandwidth of the op-amps A1 and A2, which is likely from DC to about 5 MHz. So for a limited frequency range (e.g., from DC to about 2 MHz), the outputs of the op-amps A1 and A2 are equal in magnitude (but opposite in sign) to the voltages at nodes N1 and N4.

FIG. 4 also shows how a differential amplifier A3 can be used to convert voltages VA and VB to the form VO=Kp(VP)−Kn(VN). More specifically, Equation 4 below is an equation for VO of circuit 414.

$$VO = Vp \frac{R7}{R6 + R7}\left(1 + \frac{R5}{R4}\right) - Vn \frac{R5}{R4} \quad (EQ. 4)$$

Equation 5 below assumes R4=R5.

$$VO = Vp \frac{2R7}{R6 + R7} - Vn \quad (EQ. 5)$$

The dual directional coupler of the present invention includes a reverse coupler portion and a forward coupler portion. The reverse coupler case is first discussed, followed by a discussion of the forward coupler case.

Reverse Coupler Case

The reverse coupler case should have the characteristics of a reflectometer in that VO=0 when RL=Ro (i.e., the output is zero when the characteristic impedance of the coupler equals the load impedance). Equation 6 below illustrates this for the reverse coupler case.

$$-VA(K)-(-VB)=0 \quad (EQ. 6)$$

Equation 7 below solves for K.

$$K=VB/VA \quad (EQ. 7)$$

Letting Vp=VA and Vn=VB, allows Equation 5 to be rewritten as Equation 8 below.

$$VO = VA\frac{2R7}{R6+R7} - VB \quad \text{(EQ. 8)}$$

Now, assuming RL=Ro=50 ohms, and that VO=0 when RL=Ro, Equation 8 can be rewritten as Equation 9 below.

$$0 = VA\frac{2R7}{R6+R7} - VB \quad \text{(EQ. 9)}$$

Combining Equation 9 with Equation 2 results in Equation 10 below.

$$\frac{2R7}{R6+R7} = \frac{RL \cdot R3}{R2 \cdot R3 + RL(R2+R3)} \quad \text{(EQ. 10)}$$

Solving for R7 results in Equation 11 below.

$$R7 = \frac{R3 \cdot R6 \cdot RL}{2R2(R3+RL) + R3 \cdot RL} \quad \text{(EQ. 11)}$$

In other words, by selecting a value for R7 that satisfies Equation 11, then the circuit 414, shown in FIG. 4, will emulate a reverse coupler. Since this is the reverse coupler case, the term $R7_R$ will be used, with the R subscript signifying the reverse coupler case.

The pi attenuator 202 should be designed to have low insertion loss, so that minimum power is wasted. This is especially important at microwave frequencies where power is at a premium. Accordingly, it is preferred that the pi attenuator have an attenuation of less than 1 dB. For the following discussion, a pi attenuator with a value of 0.869 dB is selected, e.g., which results when R1 and R3 are 1 kilo-ohms. This is a good value for the wide range of op-amps used in developing −VA and −VB. Also assume that R2 is approximately 5 ohms. More specifically, letting R1=R3=1K, and R2=5.11, the actual insertion loss=0.885 dB, and Zo=50.088 ohms. For an ideal insertion loss of 0.869 and Z0=50, R1 and R3 would be 1K and R2 would be 5.012531. For the following examples, it is assumed that R1=R2=1K and R2=5.11 and RL=50. It is also assumed that R6=511 ohms.

$$R7_R = \frac{R3 \cdot R6 \cdot RL}{2 \cdot R2(R3+RL) + R3 \cdot RL}$$
$$= \frac{1K(511)(50)}{2(5.11)(1K+50) + 1K(5)}$$
$$= 420.7077111$$

VO is now determined for RL other than 50 ohms.

Equation 9 can be rewritten as Equation 12 shown below.

$$VB = VA\frac{2R7}{R6+R7} \quad \text{(EQ. 12)}$$

Combining Equations 8 and 12 leads to Equation 13 shown below.

$$VO = VA\left(\frac{2R7}{R6+R7} - \frac{RL \cdot R3}{R2 \cdot R3 + R1(R2+R3)}\right) \quad \text{(EQ. 13)}$$

Combining Equations 1 and 13 leads to Equation 14 (EQ. 14) shown below.

$$VO_R = Vinc\left(\frac{R1 \cdot R2 \cdot R3 + RL(R1 \cdot R2 + R1 \cdot R3)}{R1(R3 \cdot RS + R2 \cdot R3) + R2 \cdot RS + RL(R1(R2+R3+RS) + RS(R2+R3))}\right)$$
$$\left(\frac{2R7}{R6+R7} - \frac{RL \cdot R3}{R2 \cdot R3 + RL(R2+R3)}\right)$$

Assuming R1=R3=1K, R2=5.11, RS=50, R6=511 and R7=420.7077111, then Equation 14 becomes:

$$VO_R = Vinc\left(\frac{50 - RL}{49.85704395 + RL}\right)(0.10202053)$$

Table 1 below illustrates VO for various values for RL, assuming Vinc=2V.

TABLE 1

| RL | VO(mV) | dBV | Phase(deg) |
|---|---|---|---|
| 0 | +167.475 | −15.521 | 0 |
| 0.5 | +164.154 | −15.645 | 0 |
| 5.0 | +136.989 | −17.266 | 0 |
| 25 | +55.772 | −25.072 | 0 |
| 45 | +8.803 | −41.108 | 0 |
| 50 | 0 | −180.637 | 0 |
| 55.5555 | −8.801 | −41.109 | −180 |
| 100 | −55.718 | −25.080 | −180 |
| 500 | −136.669 | −17.287 | −180 |
| 5000 | −163.694 | −15.719 | −180 |
| Infinity | −166.996 | −15.546 | −180 |

In Table 1, the phase of VO is 180 degrees out of phase with the standard definition of rho, where rho=(Z−Zo)/(Z+Zo), for rho<Zo, phase=180; for rho>Zo, phase=0. Table 1 is used to illustrate that circuit 414, with appropriate values for the resistors R4, R5, R6 and R7, as defined above in Equation 11, will indeed act as a reverse coupler, where RL is a SHORT (i.e., RL=0), an OPEN (i.e., RL=infinity), or any value therebetween.

The reverse coupler case expressed in Equation 14 above can be rewritten as Equation 15 (EQ. 15) shown below.

$$VO_R = -Vinc\left(\frac{R1 \cdot R2 \cdot R3 + RL(R1 \cdot R2 + R1 \cdot R3)}{R1(R3 \cdot RS + R2 \cdot R3) + R2 \cdot RS + RL(R1(R2+R3+RS) + RS(R2+R3))}\right)$$
$$\left(\frac{RL \cdot R3}{R2 \cdot R3 + RL(R2+R3)} - \frac{2R7}{R6+R7}\right)$$

The inversion can be addressed in post processing.

Forward Coupler Case

For a forward coupler case, the circuit 414 should have the characteristics VO=(Vinc)K for all values of RL. An equation is now determined that produces a constant output VO for all values of RL from 0 to infinity.

Equation 16 below illustrates the forward coupler case, with the subscript "o" Indicating an OPEN, and the subscript "s" indicating a SHORT.

$$-(KVBo - VAo)\overset{OPEN}{=} -(KVBs - VAs)\overset{SHORT}{} \quad \text{(EQ. 16)}$$

Equation 16 can be rewritten as Equation 17 below.

$$K = \frac{VAo - VAs}{VBo - VBs} \quad \text{(EQ. 17)}$$

Equations 18 and 19 shown below are for VA and VB for OPEN.

$$VAo = Vinc \frac{R1 \cdot R2 + R1 \cdot R3}{R1(R2 + R3 + RS) + RS(R2 + R3)} \quad \text{(EQ. 18)}$$

$$VBo = Vinc \frac{R1 \cdot R3}{R1(R2 + R3 + RS) + RS(R2 + R3)} \quad \text{(EQ. 19)}$$

Equations 20 and 21 shown below are for VA and VB for SHORT.

$$VAs = Vinc \frac{R1 \cdot R2 \cdot R3}{R1(R3 \cdot RS + R2 \cdot R3) + R2 \cdot RS} \quad \text{(EQ. 20)}$$

$$VBs = 0 \quad \text{(EQ. 21)}$$

Equations 17 and 21 can be combined for SHORT, as shown in Equation 22 below.

$$K = \frac{VAo - VAs}{VBo} \quad \text{(EQ. 22)}$$

Combining equations 18, 19 and 22 leads to Equation 23, shown below.

$$K = \frac{Vinc \frac{R1 \cdot R2 + R1 \cdot R3}{R1(R2 + R3 + RS) + RS(R2 + R3)} - Vinc \frac{R1 \cdot R2 \cdot R3}{R1(R3 \cdot RS + R2 \cdot R3) + R2 \cdot RS}}{Vinc \frac{R1 \cdot R3}{R1(R2 + R3 + RS) + RS(R2 + R3)}} \quad \text{(EQ. 23)}$$

Equation 23 can be simplified to Equation 24 shown below.

$$K = \frac{R2 + R3}{R3} - \frac{R2(R1(R2 + R3 + RS) + RS(R2 + R3))}{R1(R3 \cdot RS + R2 \cdot R3) + R2 \cdot RS} \quad \text{(EQ. 24)}$$

Letting Vp=VB and Vn=VA, allows Equation 5 to be rewritten as Equation 25 below.

$$VO = VB \frac{2R7}{R6 + R7} - VA \quad \text{(EQ. 25)}$$

From FIG. 4, Equation 5 can be rewritten as Equation 26 below.

$$VO = (VB)K - VA \quad \text{(EQ. 26)}$$

Combining equations 25 and 26 leads to Equation 27 below.

$$VB \frac{2R7}{R6 + R7} - VA = (VB)K - VA \quad \text{(EQ. 27)}$$

Solving for K leads to Equation 28 below.

$$K = \frac{2R7}{R6 + R7} \quad \text{(EQ. 28)}$$

Combining Equations 24 and 28 (i.e., Let K=K) leads to Equation 29 below.

$$\frac{2R7}{R6 + R7} = \frac{R2 + R3}{R3} - \frac{R2(R1(R2 + R3 + RS) + RS(R2 + R3))}{R1(R3 \cdot RS + R2 \cdot R3) + R2 \cdot RS} \quad \text{(EQ. 29)}$$

Solving for $R7_F$ results in Equation 30 below.

$$R7_F = R6 \left( \frac{(R2 + R3)(R1(R3 \cdot RS + R2 \cdot R3) + R2 \cdot RS) - (R2 \cdot R3(R1(R2 + R3 + RS) + RS(R2 + R3)))}{(R3 - R2)(R1(R3 \cdot RS + R2 \cdot R3) + R2 \cdot RS) + (R2 \cdot R3(R1(R2 + R3 + RS) + RS(R2 + R3)))} \right) \quad \text{(EQ. 30)}$$

In other words, by selecting a value for R7 that satisfies Equation 30, then the circuit 414, shown in FIG. 4, will emulate a forward coupler. Since this is the forward coupler case, the term $R7_F$ will be used, with the F subscript signifying the reverse coupler case.

Still assuming that R1=R2=1K, R2=5.11, R6=511 and RS=50, then $R7_F$=420.3065369.

Combining Equations 26 and 28 with Equations 1 and 3 leads to Equation 31 below.

$$VO_F = Vinc \left( \frac{2R7}{R6 + R7} \right) \left( \frac{RL \cdot R1 \cdot R3}{R1(R3 \cdot RS + R2 \cdot R3) + R2 \cdot RS + RL(R1(R2 + R3 + RS) + RS(R2 + R3))} \right) - Vinc \frac{R1 \cdot R2 \cdot R3 + RL(R1 \cdot R2 + R1 \cdot R3)}{R1(R3 \cdot RS + R2 \cdot R3) + R2 \cdot RS + RL(R1(R2 + R3 + RS) + RS(R2 + R3))} \quad \text{(EQ. 31)}$$

Equation 31 can be simplified to Equation 32, shown below.

$$VO_F = Vinc \left( \frac{RL \cdot \left( R1 \cdot R3 \left( \frac{R7 - R6}{R6 + R7} \right) - R1 \cdot R2 \right) - R1 \cdot R2 \cdot R3}{R1(R3 \cdot RS + R2 \cdot R3) + R2 \cdot RS + RL(R1(R2 + R3 + RS) + RS(R2 + R3))} \right) \quad \text{(EQ. 32)}$$

Assuming R1=R2=1K, R2=5.11, RS=50, R6=511 and R7$_F$=420.3065369, then Equation 32 becomes:

$$VO_F = -Vinc\left(\frac{5.11 + RL(0.10249304)}{55.1102555 + RL(1.1053655)}\right)$$

$$= -Vinc\left(\frac{49.85704395 + RL}{49.85704395 + RL}\right)(0.09272321)$$

$$= -Vinc(0.09272321)$$

Table 2 below illustrates the VO for values for RL from 0 to infinity, assuming Vinc=2V.

TABLE 2

| RL | VO(mV) | dBV | Phase(deg) |
|---|---|---|---|
| 0 to inf | −185.446 | −14.636 | −180 |

In Table 2, the phase of VO is 180 degrees out of phase with the standard definition of Vinc. Table 2 is used to illustrate that circuit 414, with appropriate values for the resistors R4, R5, R6 and R7, as defined above in Equation 30, will indeed act as a forward coupler, when RL is a SHORT (i.e., RL=0), when RL is an OPEN (i.e., RL=infinity), or any value there-between.

Since the phase of VO$_F$ is 180 degrees from the source Vinc, the forward coupler case expressed in Equation 32 above can be rewritten as Equation 33 shown below.

$$VO_F = -Vinc\left(\frac{R1 \cdot R2 \cdot R3 - RL\left(R1 \cdot R3\left(\frac{R7-R6}{R6+R7}\right) - R1 \cdot R2\right)}{R1(R3 \cdot RS + R2 \cdot R3) + R2 \cdot RS + RL(R1(R2+R3+RS) + RS(R2+R3))}\right) \quad \text{(EQ. 33)}$$

The inversion can be addressed in post processing.

Scattering Parameters

A reflectometer can be described by scattering parameters, where scattering parameter S11 represents the value rho. More specifically, S11 (which is referred to as the "forward reflection" coefficient) is equal to the signal leaving port 1 relative to the signal being injected into port 1, or simply S11=Reflected Voltage/Incident Voltage. Accordingly, the use of Reverse and Forward Couplers can be combined to produce S11 by dividing VO$_R$ by VO$_F$, as shown in Equation 34 below.

$$S11 = \frac{VO_R}{VO_F} \quad \text{(EQ. 34)}$$

Combining Equation 34 with Equations 15 and 33, and letting D=R1(R3·RS+R2·R3)+R2·RS+RL(R1(R2+R3+RS)+ (RS(R2+R3)), leads to Equation 35 below.

$$S11 = \frac{\frac{-Vinc}{D}(R1 \cdot R2 \cdot R3 + RL(R1 \cdot R2 + R1 \cdot R3))\left(\frac{RL \cdot R3}{R2 \cdot R3 + RL(R2+R3)} - \frac{2R7_R}{R6+R7_R}\right)}{\frac{-Vinc}{D}\left(R1 \cdot R2 \cdot R3 - RL\left(R1 \cdot R3\left(\frac{R7_F - R6}{R6+R7_F}\right) - R1 \cdot R2\right)\right)} \quad \text{(EQ. 35)}$$

Equation 35 can be simplified to Equation 36 shown below.

$$S11 = \frac{(R1 \cdot R2 \cdot R3 + RL(R1 \cdot R2 + R1 \cdot R3))\left(\frac{RL \cdot R3}{R2 \cdot R3 + RL(R2+R3)} - \frac{2R7_R}{R6+R7_R}\right)}{\left(R1 \cdot R2 \cdot R3 - RL\left(R1 \cdot R3\left(\frac{R7_F - R6}{R6+R7_F}\right) - R1 \cdot R2\right)\right)} \quad \text{(EQ. 36)}$$

It can be appreciated from Equation 36 that S11 has no dependency on the Source Voltage (Vinc) or the Source Impedance (RS). Referring to FIG. 4, since the pi attenuator (made up of resistors R1, R2 and R3) and the amplifiers (A1 and A2) are used for both forward and reverse couplers, only one RF element is needed, which reduces the Through Pass Loss for the high frequency mode, e.g., greater than 2 MHz.

Assuming R1=R3=1K, R2=5.11, RS=50, R6=511, R7$_R$=420.7077111 and R7$_F$=420.3065369, then Equation 36 becomes:

$$S11 = \left(\frac{RL - 50}{RL + 49.85704395}\right)(0.90050742)$$

Table 3 below illustrates S11 for values for RL from 0 to infinity.

TABLE 3

| RL | S11 | 20 Log[S11] | Phase(deg) |
|---|---|---|---|
| 0 | −0.90770 | 0.84111 | −180 |
| 0.5 | −0.88930 | −1.01904 | −180 |
| 5.0 | −0.74060 | −2.60830 | −180 |
| 25 | −0.30100 | −10.4286 | −180 |
| 45 | −0.04749 | −26.4677 | −180 |
| 50 | 0 | −inf | −180 |
| 55.5555 | +0.04748 | −26.4689 | 0 |
| 100 | +0.30053 | −10.4423 | 0 |
| 500 | +0.73701 | −2.65055 | 0 |
| 5000 | +0.88271 | −1.08369 | 0 |
| Inf | +0.90051 | −0.91025 | 0 |

The results for the example show a constant multiplier 0.90050742 and a slight difference from 50 Ohms in the denominator. The constant multiplier is due to the attenuator through Insertion Loss, and will always represent that value. The denominator error is due to the approximate values used for R1, R2 and R3 for the 50 Ohm attenuator values. These approximations also affect the ideal Insertion Loss value. Both errors are removed when a standard Open/Short/Load (OSL) calibration is made. Table 4 below illustrates that results that would be expected for an ideal case, where for an ideal reflectometer $$S11 = \frac{RL-50}{RL+50}.$$

TABLE 4

| RL | S11 | 20 Log[S11] | Phase(deg) |
|---|---|---|---|
| 0 | −1.00000 | 0 | −180 |
| 0.5 | −0.98020 | −0.1737 | −180 |
| 5.0 | −0.81818 | −1.7430 | −180 |
| 25 | −0.33333 | −9.5424 | −180 |
| 45 | −0.05263 | −25.5751 | −180 |
| 50 | 0 | −inf | −180 |
| 55.5555 | +0.05263 | −25.5751 | 0 |
| 100 | +0.33333 | −9.5424 | 0 |
| 500 | +0.81818 | −1.7430 | 0 |
| 5000 | +0.98020 | −0.1737 | 0 |
| Inf | +1.00000 | 0 | 0 |

A comparison of Tables 3 and 4 shows that S11 parameters measured using embodiments of the present invention are close to what is ideal, but with some errors. But, as mentioned above, such errors can be removed using a standard Open/Short/Load (OSL) calibration.

Figure 5:
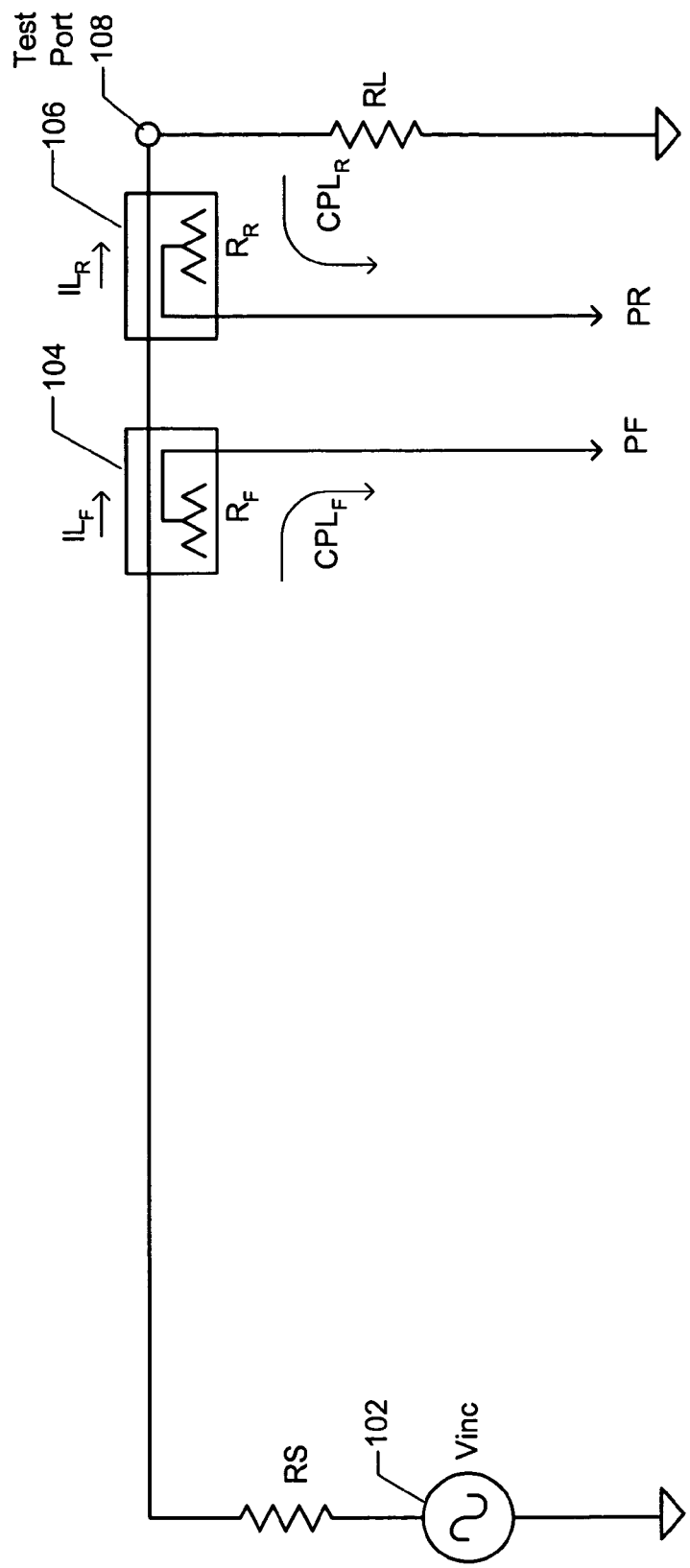
FIG. 5 is diagram that is used to illustrate the characteristics of ideal forward and reverse couplers, and to explain how embodiments of the present invention can be used to emulate such ideal couplers.

FIG. 5 illustrates a practical reflectometer using forward and reverse couplers 104 and 106 with insertion loss and coupling factor values IL and CPL in dB. From FIG. 5 it can be seen that PF and PR can be represented, respectively, by Equations 37 and 38 below.

$$PF = PINC - CPL_F \quad \text{(EQ. 37)}$$

$$PR = PINC - IL_F - IL_R - CPL_R + 20\text{Log}\left|\frac{RL-50}{RL+50}\right| \quad \text{(EQ. 38)}$$

Equation 39, below, shows scattering parameter S11 in terms of PF and PR.

$$S11_{dB} = PR - PF \quad \text{(EQ. 39)}$$

Combining Equation 39 with Equations 37 and 38 leads to Equation 40 below.

$$S11_{dB} = (PINC - IL_F - IL_R - CPL_R + 20\text{Log}\left|\frac{RL-50}{RL+50}\right| - (PINC - CPL_F) \quad \text{(EQ. 40)}$$

Letting $CPL_F = CPL_R$ and $IL_F = IL_R$, leads to Equation 41 below.

$$S11_{dB} = 20\text{Log}\left|\frac{RL-50}{RL+50}\right| - IL_R - IL_F \quad \text{(EQ. 41)}$$

Letting $CPL_F = CPL_R = 14.436$ dB and $IL_F = IL_R = 0.910254/2 = 0.455127$ dB, then Equation 41 becomes:

$$S11_{dB} = 20\log\left|\frac{RL-50}{RL+50}\right| - 0.90050742 \text{ dB}.$$

Converting this to linear leads to:

$$S11 = \left(\frac{RL-50}{RL+50}\right)(0.90050742).$$

This ideal example shows close agreement with measurements that can be obtained using embodiments of the present invention.

Figure 6:
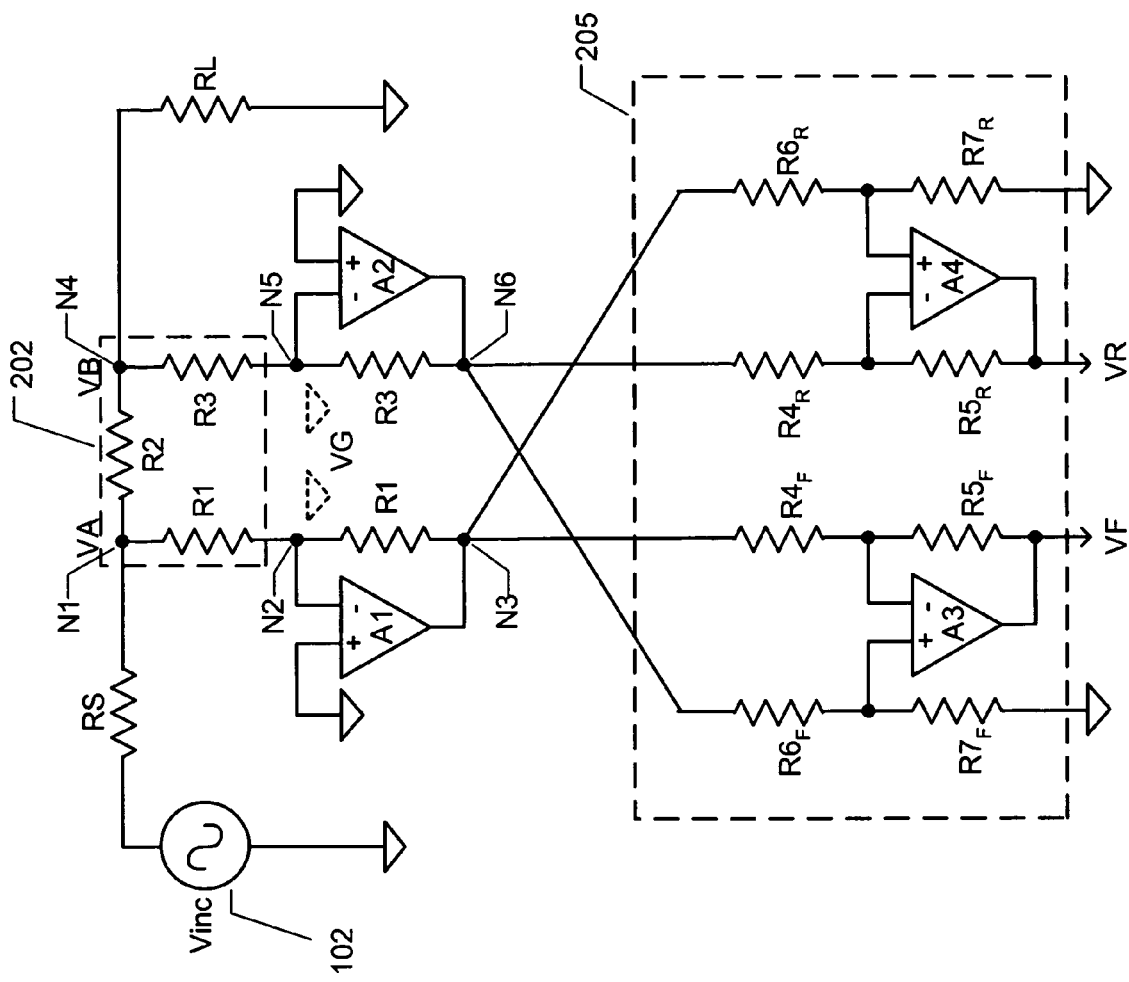
FIG. 6 illustrates details of a circuit to emulate a dual directional coupler, in accordance with embodiments of the present invention.

FIG. 6 illustrates details of the circuit 205 to emulate a dual directional coupler, in accordance with embodiments of the present invention. Resistors $R4_F$-$R7_F$ on the left emulate a forward coupler, while resistor $R4_R$-$R7_R$ on the right emulate a reverse coupler.

Figure 7:
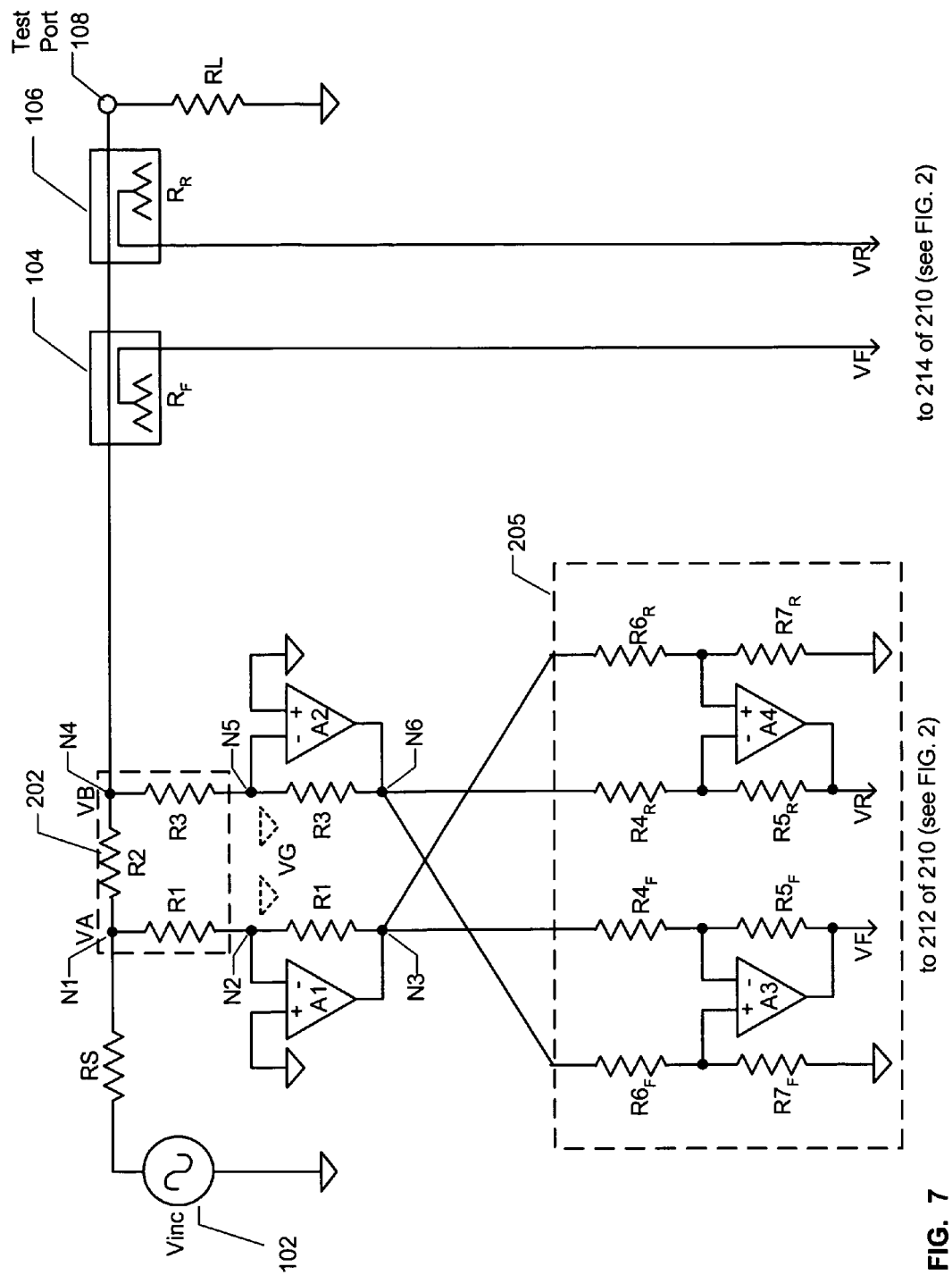
FIG. 7 illustrates how the embodiments of the present invention can be used together with an actual dual directional coupler to thereby provide a VNA capable of making measurements over a larger bandwidth than a typical VNA.

FIG. 7 illustrates how the embodiments of the present invention can be used together with a conventional dual directional coupler to thereby provide a VNA 200 capable of making measurements from the DC to multi-GHz range. In this arrangement, the circuit 205 to emulate a dual directional coupler is used when the frequency of the incident signal Vinc produced by the signal source 102 is within a first range (e.g., DC-2 MHz); and the conventional dual directional coupler made up of actual forward and reverse couplers 104 and 106 are used when the frequency of the incident signal Vinc produced by the signal source 102 is within a higher second range (e.g., 2 MHz-8 GHz).

Referring back to FIG. 2, a detector/receiver 210 that accepts the VF and VR signals from the circuit 205, as well as from couplers 104 and 106, preferably includes a baseband converter for each pair of signals. For example, a baseband converter 212 may use both upconversion and downconversion to provide baseband signals (e.g., of about 200 KHz) to a synchronous detector or DSP 216. A further baseband converter 214 will likely only used downconversion to provide baseband signals of the same frequency (e.g., of about 200 KHz) to the synchronous detector or DSP 216. In accordance with an embodiment, through the use of switches S1 and S2, only one of the baseband converters 212 and 214 provides the baseband forward and reverse signals to the synchronous detector or DSP 216. More specifically, when the frequency of the incident signal Vinc produced by the signal source 102 is within the first range (e.g., DC-2 MHz), the switches S1 and S2 provide the output of the baseband converter 212 to the synchronous detector or DSP 216. When the frequency of the incident signal Vinc produced by the signal source 102 is within the second higher range (e.g., 2 MHz to 8 GHz), the switches S1 and S2 provide the output of the baseband converter 214 to the synchronous detector or DSP 216. In this manner, the VNA can make measurements over a larger bandwidth (e.g., DC to 8 GHz).

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks illustrating the performance of specified functions and relationships thereof. The boundaries of these functional building blocks have often been arbitrarily defined herein for the convenience of the description. Alternate boundaries can be defined so long as the specified functions and relationships thereof are appropriately performed. Any such alternate boundaries are thus within the scope and spirit of the invention.

The breadth and scope of the present invention should not be limited by any of the above-described exemplary embodiments.

What is claimed is:

1. A circuit to be inserted in a signal path between a signal generator and a test port of a vector network analyzer (VNA), the circuit enabling the VNA to make scattering parameter measurements of a load (RL) connected to the test port when the signal generator generates signals having frequencies that are below a low frequency limit of an actual dual directional coupler, the circuit comprising:

a pi-attenuator including three resistors R1, R2 and R3, the resistor R2 connected in the signal path between the signal generator and the test port of the VNA, and the resistors R1 and R3 forming first and second arms of the pi-attenuator;

a first op-amp having a non-inverting (+) input, an inverting (−) input and an output, the non-inverting (+) input of the first op-amp being connected to ground, the inverting (−) input of the first op-amp being connected to the first arm of the pi-attenuator, and the output of the first op-amp being connected to the inverting (−) input of the first op-amp by a feedback resistor have a same value as the resistor R1 of the first arm of the pi-attenuator;

a second op-amp having a non-inverting (+) input, an inverting (−) input and an output, the non-inverting (+) input of the second op-amp being connected to ground, the inverting (−) input of the second op-amp being connected to the second arm of the pi-attenuator, and the output of the second op-amp being connected to the inverting (−) input of the second op-amp by a feedback resistor have a same value as the resistor R3 of the second arm of the pi-attenuator;

a third op-amp having a non-inverting (+) input, an inverting (−) input and an output, the non-inverting (+) input of the third op-amp being connected to the output of the second op-amp by a resistor $R6_F$, the non-inverting (+) input of the third op-amp being connected to ground by a resistor $R7_F$, the inverting (−) input of the third op-amp being connected to the output of the first op-amp by a resistor $R4_F$, and the output of the third op-amp being connected to the inverting (−) input of the third op-amp by a resistor $R5_F$; and a fourth op-amp having a non-inverting (+) input, an inverting (−) input and an output, the non-inverting (+) input of the fourth op-amp being connected to the output of the first op-amp by a resistor $R6_R$, the non-inverting (+) input of the fourth op-amp being connected to ground by a resistor $R7_R$, the inverting (−) input of the fourth op-amp being connected to the output of the second op-amp by a resistor $R4_R$, and the output of the fourth op-amp being connected to the inverting (−) input of the fourth op-amp by a resistor $R5_R$;

wherein a signal (VF) output by the third op-amp is indicative of a signal incident on the load (RL); and wherein a signal (VR) output by the fourth op-amp is indicative of a signal reflected from the load (RL).

2. The circuit of claim 1, wherein the signal generator has an associated source impedance (RS), and wherein:

the portion of the circuit including the third op-amp and the resistors $R4_F$, $R5_F$, $R6_F$ and $R7_F$ act as a forward coupler when $$R7_F = R6_F \left( \frac{(R2+R3)(R1(R3 \cdot RS + R2 \cdot R3) + R2 \cdot RS) - (R2 \cdot R3(R1(R2+R3+RS) + RS(R2+R3)))}{(R3-R2)(R1(R3 \cdot RS + R2 \cdot R3) + R2 \cdot RS) + (R2 \cdot R3(R1(R2+R3+RS) + RS(R2+R3)))} \right);$$

and the potion of the circuit including the fourth op-amp and the resistors $R4_R$, $R5_R$, $R6_R$ and $R7_R$ act as a reverse coupler when $$R7_R = \frac{R3 \cdot R6_R \cdot RL}{2R2(R3+RL) + R3 \cdot RL}.$$

3. The circuit of claim 2, wherein:
RL≈RS≈50 ohms; or
RL≈RS≈75 ohms.

4. The circuit of claim 2, wherein the resistors R1, R2 and R3 of the pi-attenuator are selected such that the pi-attenuator causes an insertion loss in the signal path between the signal generator and the test port of less than 1 dB.

5. The circuit of claim 2, wherein:
the resistor R2 includes a first terminal and a second terminal;
the resistor R1 includes a first terminal and a second terminal, the first terminal of the resistor R1 connected to the first terminal of the resistor R2; and
the resistor R3 includes a first terminal and a second terminal, the first terminal of the resistor R3 connected to the second terminal of the resistor R2.

6. The circuit of claim 5, wherein:
the inverting (−) input of the first op-amp is connected to the first arm of the pi-attenuator by being connected to the second terminal of the resistor R1; and
the inverting (−) input of the second op-amp is connected to second first arm of the pi-attenuator by being connected to the second terminal of the resistor R3.

7. The circuit of claim 6, wherein:
the output of the first op-amp monitors a voltage at a node N1 formed by the first terminal of the resistor R2 and the first terminal of the resistor R2; and
the output of the second op-amp monitors a voltage at a node N2 formed by the second terminal of the resistor R2 and the first terminal of the resistor R3.

8. The circuit of claim 7, wherein:
the output of the first op-amp is substantially equal in magnitude and opposite in phase to the voltage at the node N1; and
the output of the second op-amp is substantially equal in magnitude and opposite in phase to the voltage at the node N2.

9. The circuit of claim 1, wherein:
the third op-amp and the resistors $R4_F$, $R5_F$, $R6_F$ and $R7_F$ emulate a forward coupler; and
the fourth op-amp and the resistors $R4_R$, $R5_R$, $R6_R$ and $R7_R$ emulate a reverse coupler.

10. The circuit of claim 1, wherein the circuit is inserted in the signal path of the VNA such that the circuit is between the signal generator and an actual dual direction coupler of the VNA.

11. A circuit to be inserted in a signal path between a signal generator and a test port of a vector network analyzer (VNA), the circuit enabling the VNA to make scattering parameter measurements for a load (RL) connected to the test port when the signal generator generates signals having frequencies that are below a low frequency limit of an actual dual directional coupler, the circuit comprising:
- an attenuator that is inserted in the signal path between the signal generator and the test port;
- a monitoring circuit connected to the attenuator to monitor voltages at two nodes along the signal path that are formed by the attenuator; and
- a dual directional coupler emulation circuit, comprising op-amps and resistors, connected to the monitoring circuit to emulate a dual directional coupler at frequencies that are below the low frequency limit of an actual dual directional coupler;
- wherein outputs of the dual directional coupler emulation circuit are indicative of signals that are incident on and reflected from the load (RL).

12. The circuit of claim 11, wherein the dual directional coupler emulation circuit comprises:
- a first circuit portion that emulates a forward coupler; and
- a second circuit portion that emulates a reverse coupler;
- wherein the first circuit portion outputs a forward signal indicative of a signal incident on the load (RL); and
- wherein the second circuit portion outputs a reverse signal indicative of a signal reflected from the load (RL).

13. The circuit of claim 12, wherein the circuit is inserted in the signal path of the VNA such that it is between the signal generator and an actual dual directional coupler of the VNA.

14. A vector network analyzer, comprising:
- a signal generator;
- a test port;
- a signal path between the signal generator and the test port;
- an actual dual directional coupler inserted in the signal path and adapted to provide forward and reverse signals useful for making scattering parameter measurements of a load (RL) connected to the test port when the signal generator generates signals having frequencies that are above a low frequency limit of the actual dual directional coupler; and
- a circuit inserted in the signal path between the signal generator and the actual dual directional coupler, the circuit adapted to provide forward and reverse signals useful for making scattering parameter measurements of the load (RL) connected to the test port when the signal generator generates signals having frequencies that are below the low frequency limit of the actual dual directional coupler, the circuit including a dual directional coupler emulation circuit to emulate a dual directional coupler at frequencies that are below the low frequency limit of the actual dual directional coupler, wherein outputs of the dual directional coupler emulation circuit are the forward and reverse signals useful for making scattering parameter measurements of the load (RL).

15. A vector network analyzer, comprising:
- a signal generator;
- a test port;
- a signal path between the signal generator and the test port;
- an actual dual directional coupler inserted in the signal path and adapted to provide forward and reverse signals useful for making scattering parameter measurements of a load (RL) connected to the test port when the signal generator generates signals having frequencies that are above a low frequency limit of the actual dual directional coupler; and
- a circuit inserted in the signal path between the signal generator and the actual dual directional coupler, the circuit adapted to provide forward and reverse signals useful for making scattering parameter measurements of the load (RL) connected to the test port when the signal generator generates signals having frequencies that are below the low frequency limit of the actual dual directional coupler,
- wherein the circuit comprises
  - an attenuator that is inserted in the signal path between the signal generator and the actual dual directional coupler;
  - a monitoring circuit connected to the attenuator to monitor voltages at two nodes along the signal path that are formed by the attenuator; and
  - a dual directional coupler emulation circuit, comprising op-amps and resistors, connected to the monitoring circuit to emulate a dual directional coupler at frequencies that are below the low frequency limit of the actual dual directional coupler;
  - wherein outputs of the dual directional coupler emulation circuit are the forward and reverse signals useful for making scattering parameter measurements of the load (RL).

16. A vector network analyzer, comprising:
- a signal generator;
- a test port;
- a signal path between the signal generator and the test port;
- an actual dual directional coupler inserted in the signal path and adapted to provide forward and reverse signals useful for making scattering parameter measurements of a load (RL) connected to the test port when the signal generator generates signals having frequencies that are above a low frequency limit of the actual dual directional coupler; and
- a circuit inserted in the signal path between the signal generator and the actual dual directional coupler, the circuit adapted to provide forward and reverse signals useful for making scattering parameter measurements of the load (RL) connected to the test port when the signal generator generates signals having frequencies that are below the low frequency limit of the actual dual directional coupler,
- wherein the circuit comprises
  - a pi-attenuator including three resistors R1, R2 and R3 the resistor R2 connected in the signal path between the signal generator and the test port of the VNA, and the resistors R1 and R3 forming first and second arms of the pi-attenuator;
  - a first op-amp having a non-inverting (+) input, an inverting (−) input and an output, the non-inverting (+) input of the first op-amp being connected to ground, the inverting (−) input of the first op-amp being connected to the first arm of the pi-attenuator, and the output of the first op-amp being connected to the inverting (−) input of the first op-amp by a feedback resistor have a same value as the resistor R1 of the first arm of the pi-attenuator;
  - a second op-amp having a non-inverting (+) input, an inverting (−) input and an output, the non-inverting (+) input of the second op-amp being connected to ground, the inverting (−) input of the second op-amp being connected to the second arm of the pi-attenuator, and the output of the second op-amp being connected to the inverting (−) input of the second op-amp by a feedback resistor have a same value as the resistor R3 of the second arm of the pi-attenuator;
  - a third op-amp having a non-inverting (+) input, an inverting (−) input and an output, the non-inverting (+) input of the third op-amp being connected to the output of the second op-amp by a resistor $R6_F$, the non-inverting (+) input of the third op-amp being connected to ground by a resistor $R7_F$, the inverting (−) input of the third op-amp being connected to the output of the first op-amp by a resistor $R4_F$, and the output of the third op-amp being connected to the inverting (−) input of the third op-amp by a resistor $R5_F$; and a fourth op-amp having a non-inverting (+) input, an inverting (−) input and an output, the non-inverting (+) input of the fourth op-amp being connected to the output of the first op-amp by a resistor $R6_R$, the non-inverting (+) input of the fourth op-amp being connected to ground by a resistor $R7_R$, the inverting (−) input of the fourth op-amp being connected to the output of the second op-amp by a resistor $R4_R$, and the output of the fourth op-amp being connected to the inverting (−) input of the fourth op-amp by a resistor $R5_R$;

wherein a signal (VF) output by the third op-amp is indicative of a signal incident on the load (RL); and wherein a signal (VR) output by the fourth op-amp is indicative of a signal reflected from the load (RL).

17. The circuit of claim 16, wherein the signal generator has an associated source impedance (RS), and wherein:

the portion of the circuit including the third op-amp and the resistors $R4_F$, $R5_F$, $R6_F$ and $R7_F$ act as a forward coupler when $$R7_F = R6_F \left( \frac{(R2+R3)(R1(R3 \cdot RS + R2 \cdot R3) + R2 \cdot RS) - (R2 \cdot R3(R1(R2+R3+RS) + RS(R2+R3)))}{(R3-R2)(R1(R3 \cdot RS + R2 \cdot R3) + R2 \cdot RS) + (R2 \cdot R3(R1(R2+R3+RS) + RS(R2+R3)))} \right);$$

and the potion of the circuit including the fourth op-amp and the resistors $R4_R$, $R5_R$, $R6_R$ and $R7_R$ act as a reverse coupler when $$R7_R = \frac{R3 \cdot R6_R \cdot RL}{2R2(R3+RL) + R3 \cdot RL}.$$

18. The circuit of claim 17, wherein RL≈RS≈50 ohms.

19. The circuit of claim 17, wherein RL≈RS≈75 ohms.

20. The circuit of claim 17, wherein the resistors R1, R2 and R3 of the pi-attenuator are selected such that the pi-attenuator causes an insertion loss in the signal path between the signal generator and the test port of less than 1 dB.

21. The circuit of claim 17, wherein:

the resistor R2 includes a first terminal and a second terminal;

the resistor R1 includes a first terminal and a second terminal, the first terminal of the resistor R1 connected to the first terminal of the resistor R2; and the resistor R3 includes a first terminal and a second terminal, the first terminal of the resistor R3 connected to the second terminal of the resistor R2.

22. The circuit of claim 21, wherein:

the inverting (−) input of the first op-amp is connected to the first arm of the pi-attenuator by being connected to the second terminal of the resistor R1; and the inverting (−) input of the second op-amp is connected to second first arm of the pi-attenuator by being connected to the second terminal of the resistor R3.

23. The circuit of claim 22, wherein:

the output of the first op-amp monitors a voltage at a node N1 formed by the first terminal of the resistor R2 and the first terminal of the resistor R2; and the output of the second op-amp monitors a voltage at a node N2 formed by the second terminal of the resistor R2 and the first terminal of the resistor R3.

24. The circuit of claim 23, wherein:

the output of the first op-amp is substantially equal in magnitude and opposite in phase to the voltage at the node N1; and the output of the second op-amp is substantially equal in magnitude and opposite in phase to the voltage at the node N2.

25. The circuit of claim 16, wherein:

the third op-amp and the resistors $R4_F$, $R5_F$, $R6_F$ and $R7_F$ emulate a forward coupler; and the fourth op-amp and the resistors $R4_R$, $R5_R$, $R6_R$ and $R7_R$ emulate a reverse coupler.

* * * * *